US007564238B2

(12) United States Patent
Sasaki et al.

(10) Patent No.: US 7,564,238 B2
(45) Date of Patent: Jul. 21, 2009

(54) MAGNETIC DETECTION DEVICE CONNECTING ELEMENT AND DETECTION CIRCUIT AND METHOD OF MANUFACTURING THE SAME

(75) Inventors: Shinichi Sasaki, Niigata-ken (JP); Motoki Kirayama, Niigata-ken (JP); Hideto Ando, Niigata-ken (JP); Yoshito Sasaki, Niigata-ken (JP); Daigo Aoki, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 140 days.

(21) Appl. No.: 11/679,098

(22) Filed: Feb. 26, 2007

(65) Prior Publication Data

US 2008/0054890 A1 Mar. 6, 2008

(30) Foreign Application Priority Data

Aug. 30, 2006 (JP) ............................. 2006-234404

(51) Int. Cl.
*G01R 33/09* (2006.01)
*H01L 43/08* (2006.01)
*H01L 21/00* (2006.01)

(52) U.S. Cl. ...................... 324/252; 324/207.12; 438/3

(58) Field of Classification Search ............ 324/207.21, 324/252; 438/3; 360/313, 314, 315, 324, 360/325, 326, 327
See application file for complete search history.

(56) References Cited

U.S. PATENT DOCUMENTS

| 5,902,131 | A * | 5/1999 | Argos et al. .................. 438/618 |
| 6,512,369 | B2 * | 1/2003 | Heremans et al. ............ 324/252 |
| 6,732,583 | B1 * | 5/2004 | Yasuda et al. ............. 73/204.26 |
| 7,084,469 | B2 * | 8/2006 | Fukuzumi .................... 257/421 |

FOREIGN PATENT DOCUMENTS

| JP | 4-257238 | 9/1992 |
| JP | 7-45616 | 2/1995 |

\* cited by examiner

*Primary Examiner*—Kenneth J Whittington
(74) *Attorney, Agent, or Firm*—Brinks Hofer Gilson & Lione

(57) ABSTRACT

A magnetic detection device has stable characteristics having an area of a resist layer covering an insulating passivation layer, forming the magnetic detection element and a connection layer on a small stepped surface with high-precision, and preventing the resist layer from peeling, thereby providing a method of manufacturing the magnetic detection device. A resist layer 42 is overlapped through the insulating passivation layer 41 on an interconnection layer 35.

15 Claims, 4 Drawing Sheets

MAGNETIC DETECTION DEVICE CONNECTING ELEMENT AND DETECTION CIRCUIT AND METHOD OF MANUFACTURING THE SAME

BACKGROUND OF THE INVENTION

1. Field of the Invention

The present invention relates to a magnetic detection device having a detection element for sensing an external magnetic field, and a detection circuit for sensing an electric resistance of the detection element, and a method of manufacturing the magnetic detection device by using an anisotropic magnetoresistance effect (AMR effect), a giant magnetoresistance effect (GMR effect), and a tunnel magnetoresistance effect (TMR effect).

2. Description of the Related Art

A magnetic detection device for sensing an external magnetic field has been used so far as an ON-OFF switch of a noncontact type, and a rotary encoder for sensing a rotational phase or the number of rotations. A related magnetic detection device has been used as a magnetic detection device by using a hall element. However, since the magnetic detection device using the hall element needs a correction circuit, the detection circuit is complex. The magnetic detection element using a magnetoresistance effect has the advantage of making the circuit configuration of the detection circuit comparatively simple and that it is possible to detect an external magnetic field with high precision.

The magnetic detection device has the magnetic detection element and includes a magnetic detection element which is interposed between a detection circuit formed on a substrate and an insulating layer on the detection circuit. An interconnection layer forming the magnetic detection element and the magnetic circuit through a hole formed in the insulating layer is connected electrically.

In a semiconductor device, in JP-A-7-45616, for example, as shown in FIG. 2, an aluminum wiring formed on the substrate or a functional element such as a IC, is protected by covering a passivation layer (passivation film) having an insulating characteristic. A formation of the passivation layer is generally performed to separate the device from an external environment and to mechanically and chemically protect the device.

An example of the related art is disclosed in JP-A-7-45616 and JP-A-4-257238.

However, a surface of the passivation layer has a step surface when the magnetic detection element is formed into a film, and the magnetic detection element can not form a film with high precision. Accordingly, in JP-A-7-45616, although the stepped surface formed on the surface of the passivation layer is covered with a plasma-oxide layer and then a surface of the plasma-oxide layer is grinded, the method add complexity to the manufacturing process. So it is not preferable to use the above-mentioned method.

Accordingly, when the resist layer is used as a material covering a stepped surface of the surface of the passivation layer, a surface which is similar to a planar surface can be obtained without the grinding. However, a formation area of the resist layer has a problem in the above-mentioned process. That is, in accordance with the formation area of the resist layer, since there are many problems, such as cracks in the magnetic detection element formed on the resist layer and an electrode layer, a disconnection, or a peeling of the resist layer, it is not possible to manufacture the magnetic detection device having stable characteristics.

SUMMARY OF THE INVENTION

The present invention solves the above-mentioned problems. An object of the invention is to provide a magnetic detection device having a stable characteristic capable of adjusting a formation area of a resist layer covering an insulating passivation layer, and forming a magnetic detection element and a connection layer on a small stepped surface with high-precision, and preventing a film of the resist layer from being peeled, thereby providing a method of manufacturing the magnetic detection device.

According to an aspect of the invention, a magnetic detection device includes a magnetic detection element using a magnetoresistance effect in which an electric resistance varies in accordance with an external magnetic field, and a detection circuit which detects a variation in an electrical resistance of the magnetic detection element, wherein the detection circuit has an interconnection layer formed on a substrate, and the detection circuit and the substrate are covered with an insulating layer, wherein the insulating layer includes an insulating passivation layer extending from the detection circuit to the substrate. Also included is a hole extending from a portion of the interconnection layer, and a resist layer overlapping on the insulating passivation layer and having the hole at locations facing the hole formed on the insulating passivation layer in a film thickness direction, thereby eliminating a stepped surface level of the insulating passivation layer resulting from the level difference between the substrate and the detection circuit. The resist layer extends to the interconnection layer via the insulating passivation layer, and a lower edge portion of a hole formation surface on the resist layer is disposed on the insulating passivation layer so as not to allow the resist layer to directly contact to an upper surface of the interconnection layer, The magnetic detection element is formed on the surface of the insulating layer, and a conductive connection layer connected to the magnetic detection element passes through the hole and extends to an exposed surface of the interconnection layer, and the magnetic detection element and the interconnection layer are conductively connected through the connection layer.

In the invention, a surface of the insulating layer may be similar to the planar surface and the resist layer may extend to the interconnection layer by overlapping the resist layer on the insulating passivation layer. In addition, a position of the lower edge portion of the hole formation of the resist layer may be disposed so that the resist layer does not contact directly to the interconnection layer exposed from the hole. Accordingly, in the invention, the magnetic detection element and the connection layer may be formed on the insulating surface having a small step, and the film of the resist layer may be prevented from peeling, thereby providing the magnetic detection device having stable characteristics.

In the invention, the hole formation surface on the resist layer may be formed sloped so that the size of the hole gradually increases from an lower surface to an upper surface.

A hole formation surface on the insulating passivation layer may be sloped so that the size of the hole gradually increases from an lower surface to an upper surface.

Since the connection layer may be sloped, the magnetic detection element and the interconnection layer may be properly and electrically connected.

In the invention, the insulating passivation layer may be formed of stacked layers including one, two, or more kinds of Al, Cu, Al—Si, Al—Si—Cu, Cr, Ta, W, Au, Ag—Pd, Ag—Pt—Pd. Especially, the insulating passivation layer may be formed of SiN. Accordingly, the detection circuit of a manufacturing process may be protected mechanically and chemically. After the manufacturing process, the detection circuit may be properly protected from the environment.

In the invention, the interconnection layer may be formed of stacked layers including one, two, or more kinds of Al, Cu, Al—Si, Al—Si—Cu, Cr, Ta, W, Au, Ag—Pd, Ag—Pt—Pd. Especially, the interconnection layer may be formed of Al. Since the interconnection has a low resistance, the interconnection layer may be used for a wire bonding. In the invention, although the interconnection layer uses the above-mentioned materials, the resist layer may not be formed on the interconnection layer. A film of the resist layer may be prevented from peeling.

In the invention, a fixed resistance element by an external magnetic field serially connected with the magnetic detection element is formed on a surface of the insulating layer. A connection layer provided between the magnetic detection element and the fixed resistance element are conductively connected to the interconnection layer through the hole.

In the invention, the fixed resistance element may be formed of the same material layer as the magnetic detection element. Accordingly, the magnetic detection element and the fixed resistance element may prevent an imbalance of a temperature coefficient (TCR).

According to another aspect of the invention, there is provided a method of manufacturing a magnetic detection device including a magnetic detection element using a magnetoresistance effect in which an electric resistance varies in accordance with an external magnetic field, and a detection circuit which detects a variation in electrical resistance of the magnetic detection element. The method includes the steps of (a) forming the detection circuit on a substrate, (b) forming the insulating passivation layer from the detection circuit to the substrate by a sputter method or a CVD method, and forming a hole on the insulating passivation layer so that a part of an interconnection layer forming the detection circuit is exposed, (c) applying a resist layer on the insulating passivation layer, eliminating a step portion between the substrate, which is covered at least with the insulating passivation layer and the detection circuit, forming a hole which is overlapped in the direction of a thickness with the hole on the interconnection layer which is formed on the insulating passivation layer, and disposing a lower edge portion of the hole formation surface on the resist layer on the insulating passivation layer so that the resist layer is not directly contacted to an upper surface of the interconnection layer, and (d) forming the magnetic detection element on the insulating surface, extending from a conductive connection layer connected to the magnetic detection element through the hole to the exposed surface of the interconnection layer, and conducting the magnetic detection element and the interconnection layer through the connection layer.

Accordingly, in the invention, the magnetic detection element and the connection layer may be formed on the insulating surface having the small step. In addition, since a position of the lower edge portion of the hole formation surface of the resist layer is adjusted properly so that the resist layer does not directly contact the interconnection layer exposed from the hole, the film of resist layer may be prevented from peeling. Accordingly, since the resist layer does not have the disconnection problem, in comparison with a related art, the magnetic detection device exhibits good electrical stability.

In the invention, the hole formation surface formed on the insulating passivation layer in the step of (b) may be sloped so that the size of the hole gradually increases from a lower surface to an upper surface.

A hole formation formed on the resist layer in the step of (c) is sloped so that the size of the hole gradually increases from a lower surface to an upper surface.

Since the connection layer may be sloped by forming the slope and the magnetic detection element, the interconnection layer may be properly and electrically connected through the connection layer.

In the invention, in the step of (b) a hole may not formed in the insulating passivation layer, a formed resist layer formed in the step of (c) may be used as a mask, the insulating passivation layer exposed from a hole formed in the resist layer is removed, and the hole in which an upper surface of the interconnection layer is exposed is formed on the insulating passivation layer.

The method may include the step of forming an inorganic insulating layer as an underlying film of the magnetic detection element on the resist layer between the step of (c) and the step of (d).

In the invention, a surface of the insulating layer may be similar to the planar surface and the resist layer may extend to the interconnection layer by overlapping the resist layer on the insulating passivation layer. In addition, a position of the lower edge portion of the hole formation of the resist layer may be properly disposed so that the resist layer does not contact directly to the interconnection layer exposed from the hole. Accordingly, in the invention, the magnetic detection element and the connection layer may be formed on the insulating surface having a small step, and the film of the resist layer may be prevented from peeling, thereby providing the magnetic detection device having stable characteristics.

DESCRIPTION OF THE PREFERRED EMBODIMENTS

Figure 1:
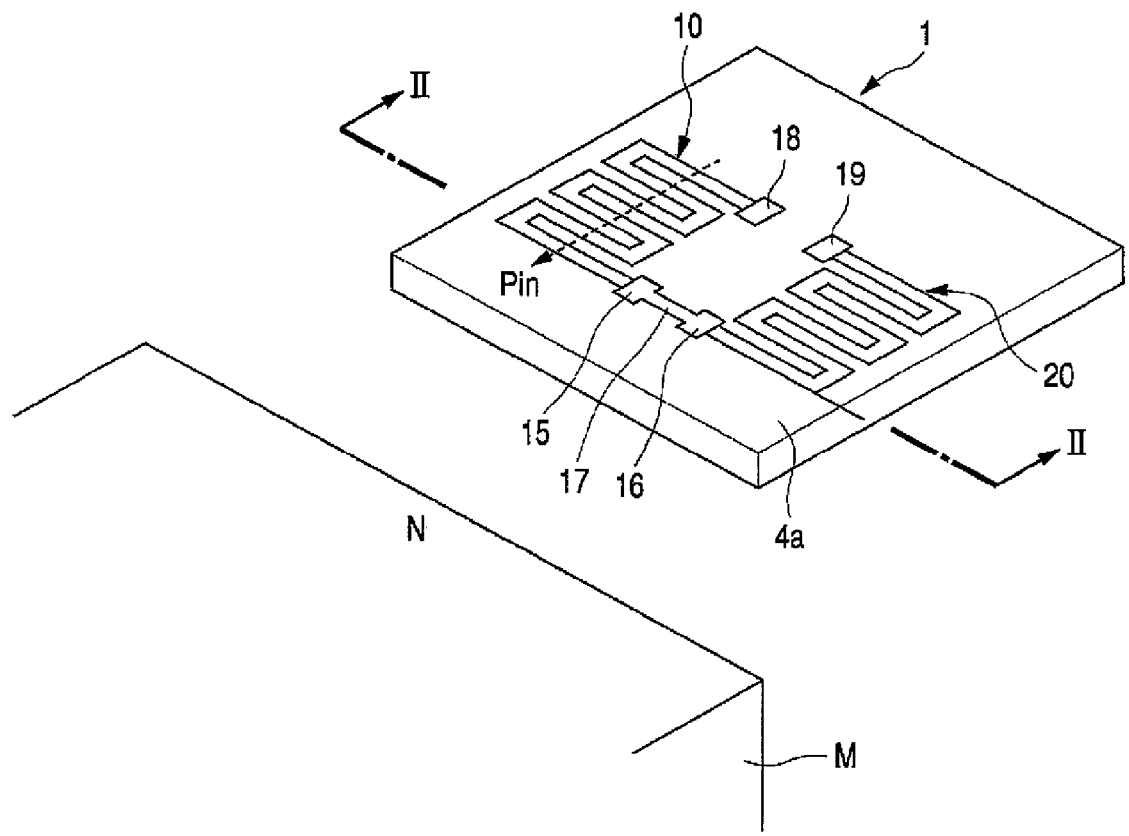
FIG. 1 is a perspective view illustrating a magnetic detection device according to an embodiment of the invention.
Figure 2:
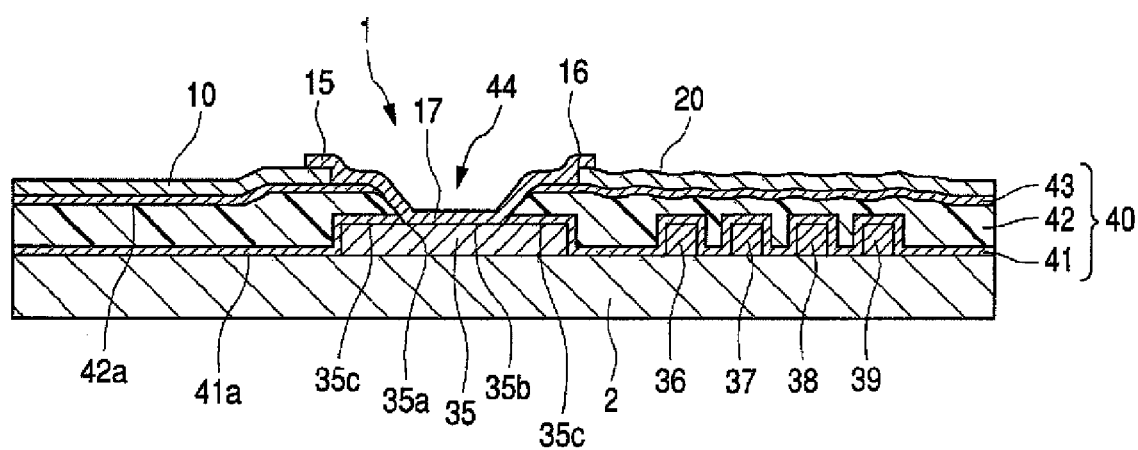
FIG. 2 is a longitudinal sectional view of a magnetic detection device taken along Line II-II of FIG. 1 according to a first embodiment of the invention.
Figure 3:
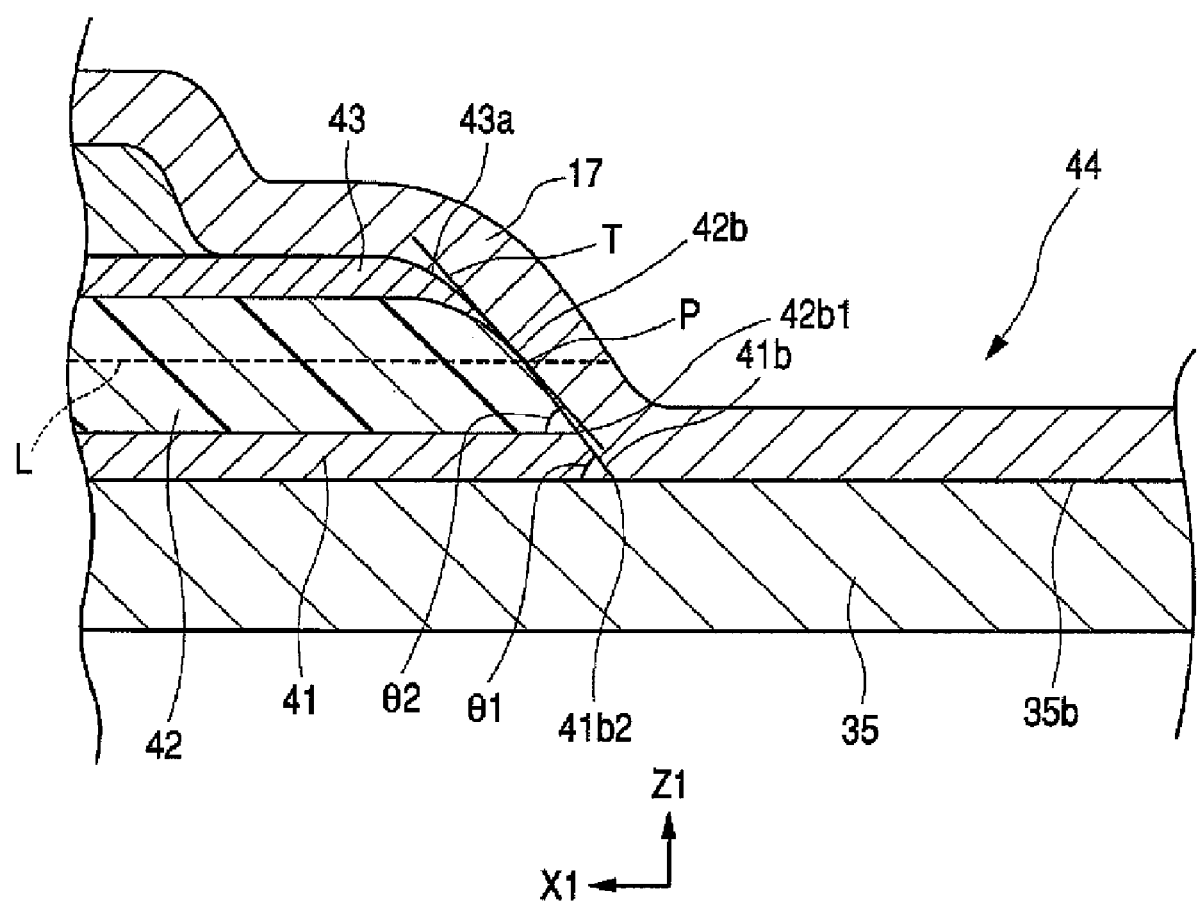
FIG. 3 is an enlarged longitudinal sectional view illustrating a part of FIG. 2.

FIG. 1 is a perspective view illustrating a magnetic detection device according to an embodiment of the invention. FIG. 2 is a longitudinal sectional view of a magnetic detection device taken along Line II-II of FIG. 1 according to a first embodiment of the invention. FIG. 3 is an enlarged longitudinal sectional view illustrating a part of FIG. 2.

The detection device 1 as shown in FIG. 1 is an IC package in which a magnetic detection device 10, a fixed resistance element 20 and a detection circuit is integrated. The detection device 1 is small in size and the detection device 1 is thin.

The magnetic detection device 1, for example, may obtain an "on output" of a pulse shape when a magnetic field generating member such as a magnet M, approaches. The magnetic detection device 1 is built in a main body portion arranging a key switch in a foldable cellular phone. A magnet M is mounted in a foldable portion having a display device of a liquid crystal device. When the main body portion and the foldable portion are folded, the magnet M approaches the magnetic detection device 1, and a magnetic field generated from the magnet M is detected in the magnetic detection device 1. Accordingly, the "on output" may be obtained from the magnetic detection device 1.

A disposition of the magnetic detection device 1 is not only limited to the cellular phone. The magnetic detection device 1 may be used in an automobile, for example, and the magnetic detection device 1 may be used in a detection portion of a seat position, a mounting detection portion of a seat belt, and the like. The magnetic detection device 1 can be used for detecting a rotational phase of a rotational magnet or the number of rotations by changing a circuit configuration.

The magnetic detection element 10 makes an electric resistance varied by an external magnetic field by using a magnetoresistance effect. The fixed resistance element 20 substantially has a same electric resistance and a same temperature coefficient in accordance with the magnetic detection device 10. Accordingly, the electric resistance of the fixed resistance element 20 does not substantially vary when applied with the external magnetic field having the same magnitude as that applied to the magnetic detection element 10.

The magnetic detection element 10 detects the external magnetic field by using a giant magnetoresistance effect (a GMR effect). The magnetic detection element 10 includes a basic stacked structure of anti-ferromagnetic layer/a fixed magnetic layer/a non-magnetic layer/a free magnetic layer. The anti-ferromagnetic layer is formed of Ir—Mn alloy (Iridium-Manganese alloy) or Pt—Mn alloy (Platinum-Manganese alloy). The fixed magnetic layer or the free magnetic layer is formed of Co—Fe alloy (Cobalt-Iron alloy) or Nickel-Iron alloy. The non-magnetic layer is formed of a non-magnetic conductive material such as Cu, and the like. The magnetic detection element 10 is formed of passivation layer, an underlying layer, and so on.

It is preferable that the fixed resistance element 20 is formed of the same material layer as the magnetic detection element 10. That is, the fixed resistance element 20 includes the anti-ferromagnetic layer, the fixed magnetic layer, the non-magnetic layer, or the free magnetic layer, which are formed of the same material in accordance with the magnetic detection element 10. However, since the stacked sequence is different from the magnetic detection element 10, in the fixed resistance element 20, for example, the stacked sequence is formed the anti-ferromagnetic layer/the fixed magnetic layer/the free magnetic layer/the non-magnetic layer (sequence or the inverse sequence) from the bottom. The free magnetic layer forming the fixed resistance element 20 is formed into the magnetic layer, which is fixed with a magnetization direction with the fixed magnetic layer. Accordingly, the resistance value does not vary by a variation of the external magnetic field (it is no longer a free magnetic layer). Also, it is optimal that each layer forming the fixed resistance element 20 is formed of the same material as each layer of the magnetic detection element 10, and having a thickness so as to prevent an imbalance of a temperature coefficient (TCR).

The magnetic detection element 10 may be an AMR element by using the anisotropic magnetoresistance effect and a TMR element by using the tunnel magnetoresistance effect other than a GMR element.

As shown in FIG. 1, a planar shape is formed by a meandering pattern in the magnetic detection element 10 or the fixed resistance element 20, and a basic resistance value increases. A consumption current may be reduced by forming the meandering pattern. The fixed magnetic layer forming the magnetic detection element 10 is fixed with magnetization in a Pin direction by an anti-ferromagnetic coupling as shown in FIG. 1. That is, the fixed magnetic layer is magnetized and fixed in the direction perpendicular to a length direction of the magnetic detection element 10. Accordingly, as shown in FIG. 1, for example, when the North pole of the magnet M approaches and the free magnetic layer forming the magnetic detection element 10 is magnetized in the direction opposite to that of the Pin direction, the resistance value of the magnetic detection element 100 is maximized. In addition, when the magnet M retreats and the external magnetization applying to the free magnetic layer are removed, the resistance value of the magnetic detection element 10 is minimized.

As shown in FIG. 1, the one end of the magnetic detection element 10 is provided with an electrode layer (connection layer) 15, which is formed of a low-resistance material, and the other end of the magnetic detection element 10 is provided with an electrode layer (connection layer) 18 which is formed of the low-resistance material. The one end of the fixed resistance element 20 is provided with an electrode layer (connection layer) 16 which is formed of the low-resistance material and the other end of the fixed resistance element 20 is provided with an electrode layer (connection layer) 19 which is formed of the low-resistance material. The electrode 15 of the magnetic detection element 10 and the electrode layer 16 of the fixed resistance element 20 are connected in a lead layer (connection layer) 17, and the magnetic detection element 10 and the fixed resistance element 20 are connected in series. The electrode layer and the lead layer are mainly formed of a low-resistance material such as gold, silver, copper, and so on, for example, chrome/copper/chrome are stacked. Accordingly, the electrode layer 15, 16 and the lead layer 17 are formed integrally with each other.

One of the electrode layers 18 and 19 is an input terminal, the other of the electrode layer 18, 19 is an earth terminal, and the lead layer 17 is an output terminal. When the external magnetic field is not present, a potential of the output terminal is a central potential. When the external magnetic field is present, the resistance value of the magnetic detection element 10 varies. Accordingly, the potential in the lead layer 17 varies. In accordance with the detected result, the potential in the lead layer 17 varies. In the detection circuit which is connected to the lead layer 17, the potential variation is detected based on the resistance variation of the magnetic detection element 10 to the external magnetic field. Accordingly, based on the detected result, an on-off type switching signal can be generated.

As shown in FIG. 2, in the magnetic detection device 1, for example, an underlying film formed of $SiO_2$ which is not denoted on the substrate 2 formed of Si is formed of a uniform thickness.

An interconnection layer 35 or active elements 36 to 38, a resistor 39, and the like forming the detection circuit are formed on the underlying film. The active elements 36 to 38 are an IC, a differential amplifier, a comparator, and an output transistor.

It is preferable that the interconnection layer 35 is formed of stacked layers including one, two, or more kinds of Al, Cu, Al—Si, Al—Si—Cu, Cr, Ta, W, Au, Ag—Pd, Ag—Pt—Pd. Among the above-mentioned materials, it is preferable that the interconnection layer 35 is formed of the Al. Accordingly, the interconnection layer 35 is formed of a low resistance and a wire bonding (not shown) is properly performed.

Although an upper surface 35a of the interconnection layer 35 is formed as a planar surface, an exposed surface 35b of the interconnection layer 35 exposed from a hole portion 44 formed in an insulating layer 40 can be a stepped surface, which is formed lower than a peripheral plane 35c of the exposed surface 35b.

As shown in FIG. 2, the interconnection layer 35, the active element 36, the active element 37, the active element 38, the active element 39, the resistor 39, and the substrate 2, and the insulating layer, 40 is formed, which is formed in an order of an insulating passivation layer 41, a resist layer 42, and an insulating coating layer 43 from the bottom.

In the insulating layer 40, a hole portion 44 is formed on a part on the interconnection layer 35, and the upper surface 35a of the interconnection layer 35 from the hole portion 44 is exposed. The shape of the hole portion 44 is not limited to a circular shape, a rectangle shape, and so on.

As shown in FIG. 2, the insulating passivation layer 41 (passivation film) is formed on the interconnection layer 35, the active element 36, the active element 37, the active element 38, the resistor 39, and the whole area of the substrate 2 other than the hole portion 44. For example, it is preferable that the insulating passivation layer 41 is formed of stacked layers by sputtered method and a CVD method including one, two, or more kinds of SiN, $SiO_2$, $Al_2O_3$, TEOS (Tetraethoxysilane), $Ta_2O_5$. Among the materials, it is preferable that the insulating passivation layer 41 is formed of SiN.

Accordingly, the interconnection layer 35, the active element 36, the active element 37, the active element 38, and the resistor 39 may be properly protected. In addition, the insulating passivation layer 41 serves as a bonding layer to enhance adhesiveness between the resist layer 42 and the interconnection layer 35.

An average thickness of the insulating passivation layer 41, which is formed by the sputter method has a thickness of 0.5 μm. On the other hand, a thickness of the interconnection layer 35, the active elements 36 to 38, is 0.1~1.5 μm in thickness. A surface 41a of the insulating passivation layer 41 is formed of a precipitous stepped surface by a step portion between the interconnection layer 35 and the substrate 2, the step portion by the active elements 36 to 38 and the substrate 2.

In the present embodiment, the resist layer (planarized resist) 42 is formed on the insulating passivation layer 41. In a recessed portion formed in the surface 41a of the insulating passivation layer 41, the resist layer 42 is filled. The surface 42a of the resist layer 42 is close to the planarization plane than to the surface 41a of the insulating passivation layer 41. Especially, although in an area where the detection circuit is not formed, the surface 41a of the insulating passivation layer 41 includes the same high planarization rate as the surface 42a of the resist layer 42. The surface 41a of the insulating passivation layer 41 has a low planarization rate compared to the surface 41a of the resist layer 42 in a portion where the detection circuit is formed. At least the step portion between the substrate and the detection circuit may be alleviated more than the insulating passivation layer 41 by overlapping the resist layer to the insulating passivation layer On the whole, the surface 42a of the resist layer 42 is more close to the planarization than to the surface 41a of the insulating passivation layer 41.

The resist layer 42 is provided so as to stabilize the high insulating characteristics and place the insulating surface closer to the planarization surface. The planarization rate, for example, is defined as an average roughness as an index. In addition, the average thickness is 0.5~1.0 μm on the interconnection layer 35 of the resist layer 42.

An insulating coating layer 43 (inorganic insulating layer) is formed on the resist layer 42, which is formed of stacked layers, including one, two, or more kinds of silicon nitride (SiN), silica dioxide ($SiO_2$), alumina ($Al_2O_3$). By providing the insulating coating layer 43, the insulating characteristic can be obtained. In addition, the insulating coating layer 43 formed of the inorganic insulating layer is suitable for the underlying layer of the magnetic detection element 10, which is formed on the insulating layer 40.

As shown in FIG. 2, the resist layer 42 is formed on a whole area of the interconnection layer 35, the active elements 36 to 38, the resistor 39, and the substrate 2 other than the hole portion 44, through the insulating passivation layer 41.

In the present embodiment, as shown in FIG. 3, a lower edge portion 42b1 of a hole formation surface 42b of the resist layer 42 is provided on the insulating passivation layer 41 in a direction (X1 direction in the figure) away from an exposed surface 35b of the interconnection layer 35 than a lower edge portion 41b2 of a hole formation surface 41b of the insulating passivation layer 41. That is, since the resist layer 42 does not extend to the exposed surface 35b of the interconnection layer 35, the resist layer 42 and the interconnection layer 35 are not directly connected each other.

As shown in FIGS. 2 and 3, the magnetic detection element 10 and the fixed resistance element 20 are formed on the insulating coating layer 43, which is formed on the resist layer 42. The electrode layers 15, 16, 1 8, and 19 are formed in each end portion of the magnetic detection element 10 and the fixed resistance element 20. As shown in FIGS. 2 to 3, a lead layer 17, which connects the electrode layer 15 of the magnetic detection element 10 and the electrode 16 of the fixed resistance element 20, is formed in the hole portion 44 through on the hole formation surface 43a of the insulating coating layer 43, the hole formation 42b of the resist layer 42, the hole formation 41b of the insulating passivation layer 41, and the exposed surface 35b of the interconnection layer 35. Accordingly, the magnetic detection element 10 and the fixed resistance element 20 are connected with each other on the interconnection layer 35 through the electrode layer 15, the electrode layer 16, and the lead layer 17.

In addition, the hole portion 44 formed on the insulating layer 40 is formed on the electrode layer 18 of the magnetic detection element 10 and an opposed position with the electrode 19 of the fixed resistance element 20, The hole portion 44 includes the same end portion shape as FIG. 3, is electrically connected on the interconnection layer in which the magnetic detection element 10 is not denoted through the electrode layer 18. In addition, the hole portion 44 is electrically connected to the interconnection layer in which the fixed resistance element 20 is not denoted through the electrode layer 19.

The characteristic part of the present embodiment is that the resist layer 42 is formed on the interconnection layer 35 through the insulating passivation layer 41 with overlapping, the lower edge portion 42a1 of the hole formation surface 42a of the resist layer 42 is disposed on the insulating passivation layer 41 so that the resist layer 42 does not extend to the exposed surface 35b of the interconnection layer 35.

As shown in FIG. 2, the surface 42a of the resist layer 42 can be disposed closer to the planarized surface than to the surface 41a of the insulating passivation layer 41. However, for example, when the resist layer 42 is formed in the planarization in a direction away from the interconnection layer 35 not overlapping the resist layer 42 on the interconnection layer 35, a rapid step portion between the resist layer 42 and the interconnection layer 35 may occur. Accordingly, it is easy for the electrode layer 15, the electrode layer 16, the electrode layer 17, the electrode layer 19, and the lead layer 17 to disconnect.

Figure 5:
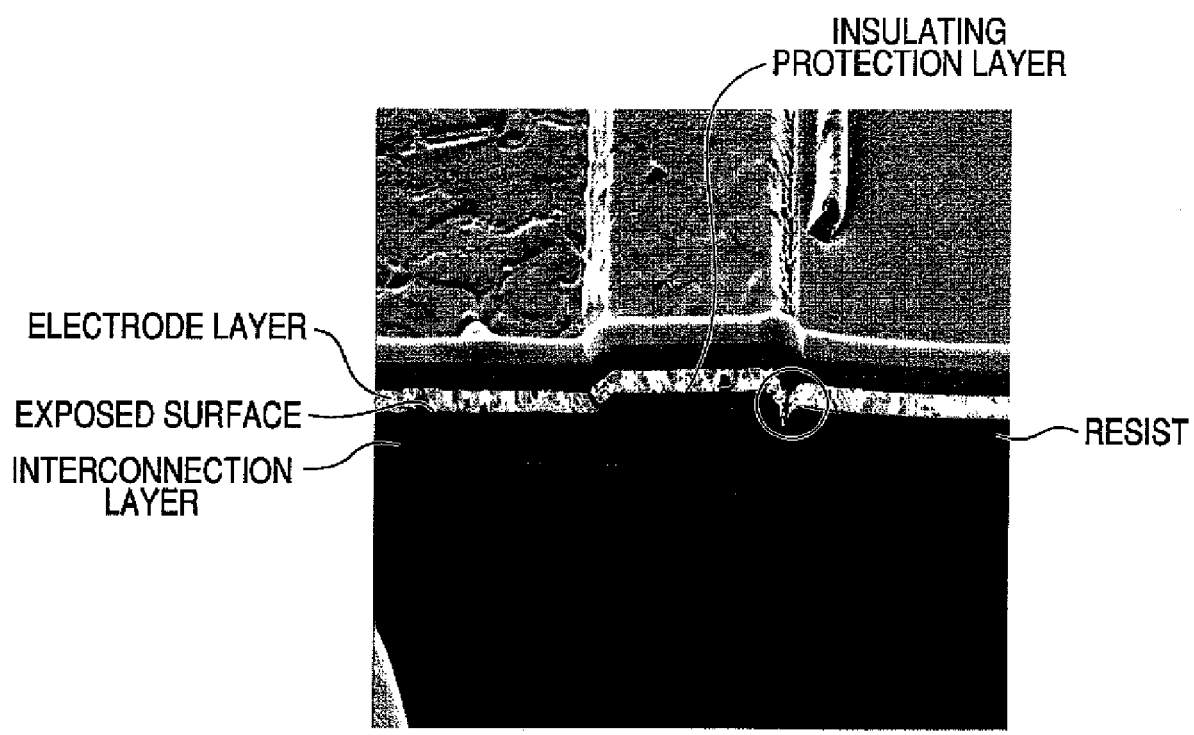
FIG. 5 is an FIB picture illustrating a longitudinal section of a magnetic detection device, where a resist layer is formed on an interconnection layer without overlapping.

FIG. 5 is an FIB picture illustrating a cross-sectional shape, where the resist layer 42 is formed on the interconnection layer 35 away from the interconnection layer 35 to the planarization direction without overlapping. As shown in FIG. 5, in the electrode layer formed extending from the resist layer 42 to the insulating passivation layer 41 and the exposed portion 35b of the interconnection layer 35, the disconnection occurs due to the rapid step portion in a location shown by a circle in the drawing.

Accordingly, as shown in FIG. 3, it is possible that the whole formation surface, such as the electrode layer 15, the electrode layer 16, the electrode layer 18, the electrode layer 19, and the lead layer 17 have a small stepped portion and are sloped extending from the resist layer 42 to the interconnection layer 35 other than the hole portion 44. Accordingly, it is difficult to disconnect the electrode layer 15, the electrode layer 16, the electrode layer 17, the electrode layer 18, the electrode layer 19, and the lead layer 17.

In addition, in the present embodiment, the resist layer 42 does not extend to the exposed surface 35b of the interconnection layer 35. That is, the resist layer 42 and the interconnection layer 35 are not directly connected. Since the adhesion between the resist layer 42 and the interconnection layer 35, especially, and the adhesion by Al with the interconnection layer 35 is low, it is easy to be peeled on the interconnection layer 35. In addition, it is easy for the resist layer 42 to be peeled by a heat treatment, and the like, which is performed during the formation process of the magnetic detection element 10. On the other hand, the adhesion between the insulating passivation layer 41 and the interconnection layer 35 and the adhesion between the insulating passivation layer 41 and the resist layer 42 are substantially higher than the adhesion at the time of directly connecting the resist layer 42 and the interconnection layer 35 each other. Accordingly, in the present embodiment, the lower edge portion of the hole formation surface 42b of the resist layer 42 is disposed on the insulating passivation layer 41, and the resist layer 42 does not extend to the exposed surface 35b of the interconnection layer 35. Accordingly, in the interconnection layer 35, the film of the resist layer 42 can be prevented from peeling. Accordingly, a crack or a disconnection is prevented, which contributes to the film peeling on the resist layer 42 to the electrode layer 15, the electrode layer 16, the electrode layer 18, the electrode layer 19, and the lead layer 17. In addition, although when the film peeling occurs, corrosion of the detection circuit can occur by contact from the place where the crack or the disconnection occurs, the detection circuit can be properly sealed by the insulating layer 40 in the present embodiment. According to the embodiment, the magnetic detection device 1 having stable characteristics can be obtained.

In addition, the lower edge portion 42b1 of the hole formation surface 42b of the resist layer 42 can be at the same position as the lower edge portion of the hole formation 41b of the insulating passivation layer 41. In the insulating passivation layer 41, the insulating passivation layer 41 includes the lower edge portion 41b1. However, since a lower edge portion 42b1 of the resist layer 42 is provided on the insulating passivation layer 41 in a direction away from an exposed surface 35b of the interconnection layer 35, the whole resist layer 42 may be overlapped only on the insulating passivation layer 41. Accordingly, a film of the resist layer 42 may be prevented from peeling in the interconnection layer 35.

In the present embodiment, the magnetic detection element 10 of a multilayer structure can include a high precision and the magnetic detection element 10 having stable characteristics can be,detected by forming the magnetic detection element 10 on the resist layer 42 of which a surface is closer to the planar surface than to the insulating passivation layer 41.

In addition, since the interconnection layer 35 of the detection circuit and the lead layer 17 are disposed on the overlapped position and are conducted each other up and down, it is preferable that the interconnection layer 35 and the lead layer 17 can make the device small compared to the interconnection layer 35 and the lead layer 17 is disposed on a plane surface.

As shown in FIG. 3, as the hole formation 41b of the insulating passivation layer 41 from the lower surface to the upper surface (i.e. as facing the denoted Zl direction as shown in FIG. 3), the hole formation surface 41b is formed on an slope so that a size (a plane area of the hole) of the hole portion 44 increases gradually. Similarly, as the hole formation surface 42b of the resist layer 42 facing from the upper side (i.e. as facing the denoted Z1 direction as shown in FIG. 3), the hole formation surface 42b is formed on the slope so that a size of the hole portion 44 increases gradually. The slope, as shown in FIG. 3, can be straight or curved as Viewed from the thickness to a cut end surface. The curved line shape can be a convex in shape or the hole formation surface 41 and 42b can be a recessed portion. It is preferable that an angle θ1 between the hole formation surface 41b (when the end portion of the hole formation is curved in shape, referring to the a line passing through a thickness center of the insulating passivation layer 41, a tangent line in a point crossing the hole formation surface, and the hole formation surface 42b) and the lower surface of the insulating passivation layer 41 and angle θ2 between the hole formation surface 42 (when the end surface of the hole formation surface, a tangent line T of a point P (tangent point) where a line L passing through a film thickness center of the resist layer 42 and the hole formation surface 42b are cross) and the lower surface of insulating passivation layer 41 are about 45°.

As the hole formation surface 42b of the resist layer 42 and the hole formation surface 41b of the insulating passivation layer 41 are formed on the slope, the surface from the hole formation surface 41b and the hole formation surface 42b to the exposed surface 35b the interconnection layer 35 can be formed as gradual shape. Accordingly, the electrode layer 15, 16, 17, 18, 19, and the lead layer 17 may be formed on the hole formation surface 42b of the resist layer 42 and the hole formation surface 41b of the insulating passivation layer 41 without disconnection in a predetermined thickness.

In addition, in the embodiment as shown in FIG. 3, the hole formation surface 42b of the resist layer 42 and the hole formation surface 41b of the insulating passivation layer 41 are formed of a sequence slope without the step portion. Such a shape can be made by the method of manufacturing hereinafter. Accordingly, the electrode layer 15, 16, 18, 19, and the lead layer 17 can be properly formed in the predetermined size without the disconnection.

As shown in FIG. 3, although the insulating coating layer 43 is only formed on the resist layer 42, the insulating coating layer 43 can extend to the hole formation surface 41b of the insulating passivation layer 41. Accordingly, the insulating coating layer 43 can extend to the exposed surface 35b so as not to cover the whole exposed surface 35b of the interconnection layer 35.

The method of manufacturing the magnetic detection device 1 of the embodiment will be described by using FIG. 4. In the process as shown in FIG. 4, a detection circuit 60 having a plurality set of an interconnection layer 35, active elements 36 to 38, and a resistor 39, and the like is formed on the substrate 2. The detection circuit 60 is formed by a thin-film forming process such as a CVD process, sputter process, a plating process, and so on.

Next, the insulating passivation layer (passivation film) 41 which is formed of the silicon nitride (SiN), is formed by the sputter method or the CVD method on each detection circuit 60 and the substrate 2. In addition, in FIG. 4, although the surface 41a of the insulating passivation layer 41 on the detection circuit 60 is flat, the flat shape is representational, and does not mean that a recessed portion cannot be formed. Similar to FIG. 2, the surface 41a of the insulating passivation layer 41 formed on the detection circuit 60 can be converted into the recessed shape.

Figure 4A:
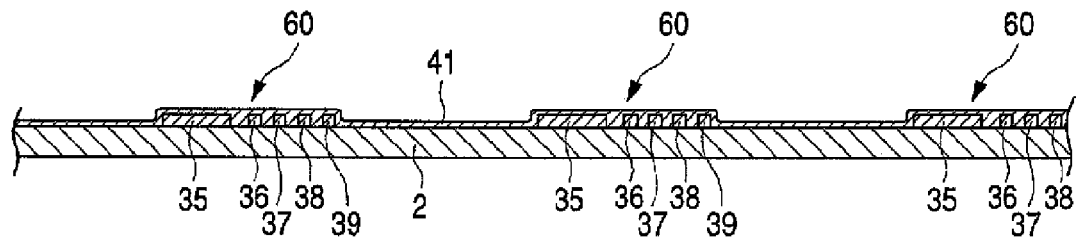
FIGS. 4A to 4D are process views illustrating a manufacturing process of a magnetic detection device according to the embodiment (taken along Line II-II of FIG. 2)
Figure 4B:
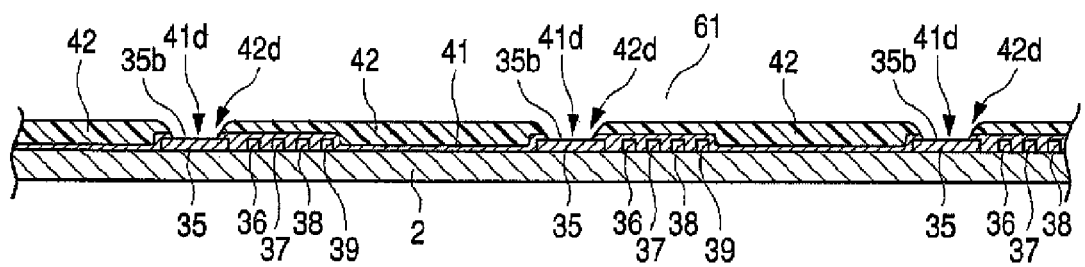

Next, in the process as shown in FIG. 4B, for example, the resist layer 42d is precisely formed at a position which is in the direction of a part of the upper surface of the interconnection layer 35 and in the direction of the thickness opposed to by applying the resist layer 42 on the insulating passivation layer 41 to the whole surface and exposing and developing the resist layer 42. Accordingly the insulating passivation layer 41, which is not covered on the hole portion 42d, is removed by an etching. At this time, one portion of the interconnection layer 35 is cut slightly and the exposed portion 35d of the interconnection layer 35 can have a recessed shape.

As shown in FIG. 4, the hole portion 41d is formed on the insulating passivation layer 41 by removing the insulating passivation layer 41 by etching and a part of the interconnection layer 35 from the hole portion 41d as the exposed surface 35b.

Thereafter, the resist layer 42 is thermally hardened. In the embodiment, before the resist layer 42 is thermally hardened, it is preferable that a predetermined heating process is performed to sag the hole formation surface 42b of the resist layer 42, thereby forming the slope shown in FIG. 3.

For example, the resist layer 42 is subjected to a post-baking process at 130° C. for 10 minutes, and then is subjected to, for example, the thermal hardening process in the atmosphere of nitrogen at 300° C. for 60 minutes.

In the process as shown in FIG. 4, by performing the heat-process on the resist layer 42, the hole formation surface 42b of the resist layer 42 is sagged and the inclination surface is formed as shown in FIG. 3. In addition, when the insulating passivation layer 41 is removed by the etching method from the hole formation portion 42d of the resist layer 42 by forming the hole formation surface 42b of the resist layer 4, as shown in FIG. 3, the hole formation surface 41b which is formed on the insulating passivation layer 41, by etching and tracing the sloped shape.

According to the above-mentioned method, the resist layer 42 extends on the interconnection layer 35, as shown in FIG. 3, the hole formation surface 42b of the resist layer 42 and the hole formation 41b of the insulating passivation layer 41 all can be formed of the sloped surface, and the hole formation surfaces 41b, 42b can be formed of a continuous surface. In addition, the lower edge portion 42b of the hole formation 42b of the resist layer 42 may be formed than the lower edge portion 41b1 of the hole formation 41b of the insulating passivation layer 41

In the above-mentioned process of FIG. 4B, the resist layer 42 of the predetermined shape and the insulating passivation layer 41 can be formed. In particular, in the above manufacturing method, the resist layer 42 is used as a mask by etching the insulating passivation layer 41 from the hole formation portion 42d formed on the resist layer 42. Accordingly, the hole portion 41d can be formed to the insulating passivation layer 41.

However, after forming the hole portion 41d to the insulating protection 41, the formation of the resist layer 42, that is, the formation of the hole portion 41d to the resist layer 42, can be performed.

Although in the above-mentioned manufacturing method, the upper surface 35a of the interconnection layer 35 is easily affected by the etching method. However, in order that the upper surface 35a of the interconnection layer 35, before forming the insulating passivation layer 41 of FIG. 4A by the sputter method, a part of the resist layer for a liftoff is formed on the interconnection layer 35, the insulating passivation layer 41 is formed on the detection circuit 60 which is not covered with the resist layer for the liftoff by the sputter method, and then the resist layer for the lift off is removed. Then, the formation of the resist layer 42—that is the formation of the hole formation 41d, is performed to the resist layer 42.

Figure 4C:
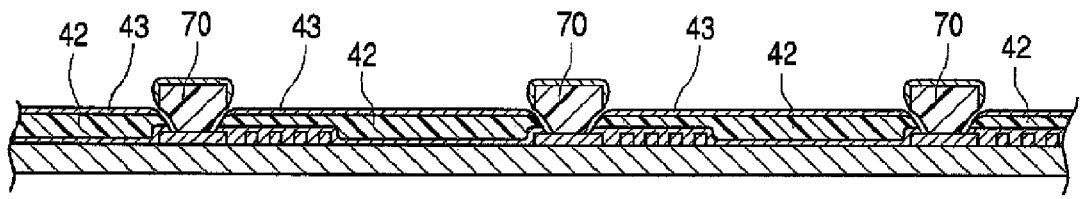

In the process of shown in FIG. 4C, the resist layer 70 for the liftoff the hole portion 41d, 42d which is formed in the insulating passivation layer 41, the resist layer 42 and the insulating passivation layer applying layer 43 formed on the resist layer 42 by using $Al_2O_3$, and so on is formed by the sputter method. A quality layer, such as the insulating coating layer 43 is attached on the resist layer 70 for the liftoff. Then, the resist layer 70 for the liftoff is removed.

Then, the magnetic detection element 10 and the fixed resistance element 20 are formed on the insulating coating layer 43. Accordingly, forming the electrode layer 15, 16, 18, 19, and the lead layer 17 is performed. The lead layer 17 or the electrode 18, 19 extends to the exposed surface 35b of the interconnection layer 35. Accordingly, the interconnection layer 35 and the magnetic detection element 10 are electrically connected or the interconnection layer 35 and the fixed resistance element 20 are electrically connected.

It is possible that the electrode layer 15, 16, 18, 19, and the lead layer 17 is formed by the non-magnetic conductive material by using the sputter method and a plating method.

Figure 4D:
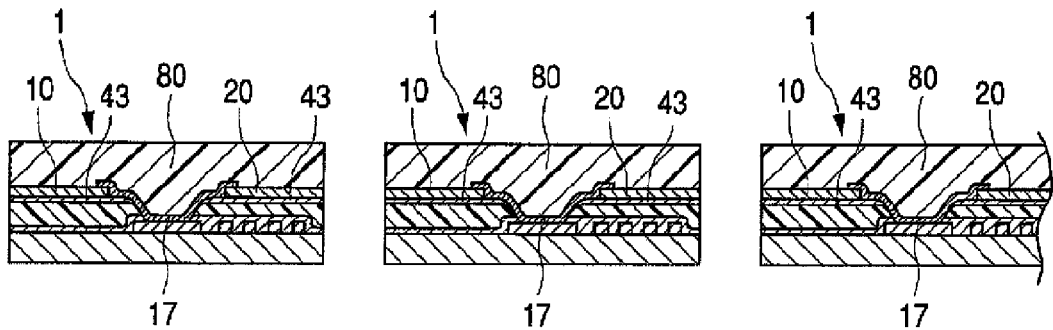

Next, in the process shown in FIG. 4D, the magnetic detection element 10 and the fixed resistance element 20 are molded with a resin 80 to form a package, and then are divided into the respective magnetic detection devices 1 by a dicing process. Each magnetic detection device 1 is diced. In the embodiment, it is possible that the insulating surface can be closer to the planarized surface than to the surface of the insulating passivation layer 41 by applying the resist layer 42 on the insulating passivation layer 41. Accordingly, the magnetic detection element 10 or the fixed resistance element 20 can be formed on the insulating surface which is closer to the planarized surface. In addition, in the manufacturing method of the embodiment, the resist layer 42 can extend to the interconnection layer 35 and the hole formation surface 42b of the resist layer 42, and the hole formation surface 41b of the insulating passivation layer 41 can be formed of a continuous surface similar to that shown in FIG. 3. The lower edge portion 42b1 of the hole formation surface 42b of the resist layer 42 can be disposed than to the lower edge portion 42b1 of the hole formation surface 41b of the insulating passivation layer 41 in a direction retreating from the exposed surface 35b of the interconnection layer 35 to the retreated position in the farther direction. Accordingly, since the formation surface of the electrode layer 15, 16, 18, 19, and the lead layer 17 are formed as a gentle slope and the resist layer 41 and the interconnection layer 35 are not connected, the resist layer 42 can not be peeled by the heat treatment, which is performed by the formation of the magnetic detection element 10, the electrode layer 15, 16, 18, 19, and the lead layer 17 can be properly formed without disconnecting, electrical stability between the magnetic detection element 10 and the interconnection layer 35 can be improved and the electrical stability between the fixed resistance element 20 and the interconnection layer 35 can be improved.

In the embodiment, although the insulating layer 40 is a three-layered structure, the insulating passivation layer 41 and the resist layer 42 may be a two-layered structure or may be formed as more than a four-layered structure.

In the embodiment, the magnetic detection element 10 and the fixed resistance element 20 are provided for example, when the magnetic detection element 10 and the fixed resistance element 20 are provided by two respectively and are formed of a bridge circuit, it is preferable that the magnetic detection device having a good magnetic sensitivity can be obtained.

In addition, in the embodiment, the magnetic detection element 10 and the fixed resistance element 20 are combined together, for example, the circuit is formed of the magnetic detection element having a different Pin direction. Or in the first magnetic detection element, when an N pole of the magnet is approached, the resistance varies, when an S pole of the magnet is approached, the resistance varies. In the second magnetic detection element, when an N pole is approached, the resistance does not vary. In the embodiment, the first magnetic detection element and the second magnetic element may be combined together to form a circuit.

What is claimed is:

1. A magnetic detection device comprising:
    a magnetic detection element using a magnetoresistance effect in which an electric resistance varies in accordance with an external magnetic field; and
    a detection circuit which detects a variation in an electrical resistance of the magnetic detection element,
    wherein the detection circuit having an interconnection layer is formed on a substrate and the detection circuit and the substrate are covered with an insulating layer,
    wherein the insulating layer is formed in an order of an insulating passivation layer, a resist layer and an insulating coating layer from the bottom, wherein the insulating passivation layer extends from the detection circuit to the substrate and having a hole extending from a portion of the interconnection layer, and the resist layer overlaps the insulating passivation layer and has the hole at locations facing the hole formed on the insulating passivation layer in a film thickness direction, thereby eliminating a step in the insulating passivation layer resulting from a level difference between the substrate and the detection circuit, wherein the resist layer extends to the interconnection layer via the insulating passivation layer and a lower edge portion of a hole formation surface on the resist layer is disposed on the insulating passivation layer to prevent the resist layer from directly contacting an upper surface of the interconnection layer, wherein the magnetic detection element is formed on the surface of the insulating coating layer, a conductive connection layer connected to the magnetic detection element passes through the hole and extends to an exposed surface of the interconnection layer, and the magnetic detection element and the interconnection layer are conductively connected through the connection layer.

2. The magnetic detection device according to claim 1, wherein the hole formation surface on the resist layer is sloped so that the size of the hole gradually increases from an lower surface to an upper surface.

3. The magnetic detection device according to claim 1, wherein a hole formation surface on the insulating passivation layer is sloped so that the size of the hole gradually increases from an lower surface to an upper surface.

4. The magnetic detection device according to claim 1, wherein the insulating passivation layer includes stacked layers with at least one of SiN, SiO2, Al2O3, TEOS, or Ta2O5.

5. The magnetic detection device according to claim 4, wherein the insulating passivation layer includes SiN.

6. The magnetic detection device according to claim 1, wherein the interconnection layer includes stacked layers with at least one of Al, Cu, Al—Si, Al—Si—Cu, Cr, Ta, W, Au, Ag—Pd, or Ag—Pt—Pd.

7. The magnetic detection device according to claim 6, wherein the interconnection layer includes Al.

8. The magnetic detection device according to claim 1, wherein a fixed resistance element serially connected to the magnetic detection element in which an electric resistance does not vary in accordance with an external magnetic field is a surface of the insulating layer, and a connection layer provided between the magnetic detection element and the fixed resistance element is conductively connected to the interconnection layer through the hole.

9. The magnetic detection device according to claim 8, wherein the fixed resistance element is the same material layer as the magnetic detection element.

10. A method of manufacturing a magnetic detection device including a magnetic detection element using a magnetoresistance effect in which an electric resistance varies in accordance with an external magnetic field and a detection circuit which detects a variation in electrical resistance of the magnetic detection element, the method comprising:
   (a) forming the detection circuit on a substrate;
   (b) forming the insulating passivation layer from the detection circuit to the substrate by a sputter method or a CVD method, and forming a hole on the insulating passivation layer so that a part of an interconnection layer forming the detection circuit is exposed;
   (c) applying a resist layer on the insulating passivation layer, eliminating a step portion between the substrate which is covered at least with the insulating passivation layer and the detection circuit, applying an insulating coating layer on the resist layer, forming a hole which is overlapped in the direction of a thickness with the hole on the interconnection layer which is formed on the insulating passivation layer, and disposing a lower edge portion of the hole formation surface on the resist layer on the insulating passivation layer so that the resist layer does not directly contact an upper surface of the interconnection layer, and
   (d) forming the magnetic detection element on the insulating coating surface, extending from a conductive connection layer connected to the magnetic detection element through the hole to the exposed surface of the interconnection layer, and conducting the magnetic detection element and the interconnection layer through the connection layer.

11. The method of manufacturing the magnetic detection device according to claim 10, wherein a hole formation surface formed on the insulating passivation layer in (b) is sloped so that the size of the hole gradually increases from a lower surface to an upper surface.

12. The method of manufacturing the magnetic detection device according to claim 10, wherein a hole formation formed on the resist layer in (c) is sloped so that the size of the hole gradually increases from a lower surface to an upper surface.

13. The method of manufacturing the magnetic detection device according to claim 12, wherein heat treatment is performed in the resist layer and the slope is formed before performing thermal hardening.

14. The method of manufacturing the magnetic detection device according to claim 10, wherein in (b) a hole is not formed in the insulating passivation layer, a formed resist layer formed in (c) is used as a mask, the insulating passivation layer exposed from a hole formed in the resist layer is removed, and the hole in which an upper surface of the interconnection layer is exposed is formed on the insulating passivation layer.

15. The method of manufacturing the magnetic detection device according to claim 10, the method further comprising:
   (e) forming an inorganic insulating layer as an underlying film of the magnetic detection element on the resist layer between (c) and (d).

* * * * *